US011404531B2

(12) United States Patent
Lou et al.

(10) Patent No.: US 11,404,531 B2
(45) Date of Patent: Aug. 2, 2022

(54) DISPLAY SCREENS AND DISPLAY TERMINALS

(71) Applicants: YUNGU (GU'AN) TECHNOLOGY CO., LTD., Langfang (CN); KUNSHAN GO-VISIONOX OPTO-ELECTRONICS CO., LTD., Kunshan (CN); SUZHOU QINGYUE OPTOELECTRONICS TECHNOLOGY CO., LTD., Kunshan (CN)

(72) Inventors: Junhui Lou, Kunshan (CN); Yanqin Song, Kunshan (CN); Gaomin Li, Kunshan (CN); Lu Zhang, Kunshan (CN)

(73) Assignees: YUNGU (GU'AN) TECHNOLOGY CO., LTD., Langfang (CN); KUNSHAN GO-VISIONOX OPTO-ELECTRONICS CO., LTD., Kunshan (CN); SUZHOU QINGYUE OPTOELECTRONICS TECHNOLOGY CO., LTD., Kunshan (CN)

(*) Notice: Subject to any disclaimer, the term of this patent is extended or adjusted under 35 U.S.C. 154(b) by 141 days.

(21) Appl. No.: 16/930,326

(22) Filed: Jul. 16, 2020

(65) Prior Publication Data

US 2020/0350394 A1 Nov. 5, 2020

Related U.S. Application Data

(63) Continuation of application No. PCT/CN2019/079930, filed on Mar. 27, 2019.

(30) Foreign Application Priority Data

Oct. 31, 2018 (CN) .......................... 201811290641.X

(51) Int. Cl.
*H01L 27/32* (2006.01)

(52) U.S. Cl.
CPC ...... *H01L 27/3283* (2013.01); *H01L 27/3227* (2013.01); *H01L 27/3246* (2013.01); *H01L 27/3288* (2013.01)

(58) Field of Classification Search
CPC ............. H01L 27/3283; H01L 27/3227; H01L 27/3246; H01L 27/3288
See application file for complete search history.

(56) References Cited

U.S. PATENT DOCUMENTS 7,038,672 B2 5/2006 Kurumisawa
7,068,265 B2 6/2006 Kim
(Continued)

FOREIGN PATENT DOCUMENTS

CN 1374635 A 10/2002
CN 1630436 A 6/2005
(Continued)

OTHER PUBLICATIONS

Jingjing Liao, Analysis and Application of OLED Driver or Controller, CNKI, Mar. 17, 2013.
(Continued)

*Primary Examiner* — Jay C Chang
*Assistant Examiner* — Mikka Liu
(74) *Attorney, Agent, or Firm* — Kilpatrick Townsend & Stockton LLP

(57) ABSTRACT

A display screen includes a first display area and a second display area that are adjacent to each other. The first display area is connected to the second display area. The display screen further includes a first display panel and a second display panel. The first display panel includes a first substrate, a first electrode layer formed on the first substrate, a first pixel definition layer formed on the first electrode layer, (Continued)

a second electrode layer formed on the first pixel definition layer, and electrode lead-out wires. The first electrode layer includes first electrodes. The first electrode is adjacent to the second display panel. The second electrode layer includes second electrodes. The second electrodes respectively intersect across the first electrodes. The electrode lead-out wires are respectively connected with the first electrodes, and respectively extend in parallel with the second electrodes in the same direction.

20 Claims, 6 Drawing Sheets

(56) References Cited

U.S. PATENT DOCUMENTS

| | | | |
|---|---|---|---|
| 7,394,195 | B2 | 7/2008 | Kato |
| 9,076,977 | B2 | 7/2015 | Sonoda et al. |
| 2007/0176550 | A1* | 8/2007 | Kwan .................. H01L 51/5246 313/506 |
| 2008/0220685 | A1 | 9/2008 | Johnson et al. |
| 2008/0224993 | A1 | 9/2008 | Johnson |
| 2015/0123097 | A1 | 5/2015 | Iijima et al. |
| 2016/0044751 | A1 | 2/2016 | Ikeda et al. |
| 2018/0053917 | A1 | 2/2018 | Isaka et al. |
| 2018/0083663 | A1* | 3/2018 | Yoo ..................... H04M 1/0202 |
| 2018/0108310 | A1 | 4/2018 | Dong et al. |
| 2021/0351251 | A1* | 11/2021 | Nakanishi ............. H01L 27/326 |

FOREIGN PATENT DOCUMENTS

| | | |
|---|---|---|
| CN | 101099110 A | 1/2008 |
| CN | 101288023 A | 10/2008 |
| CN | 100530316 C | 8/2009 |
| CN | 201946599 U | 8/2011 |
| CN | 105427748 A | 3/2016 |
| CN | 106663396 A | 5/2017 |
| CN | 107481666 A | 12/2017 |
| CN | 108364976 A | 8/2018 |
| CN | 207781599 U | 8/2018 |
| CN | 108520888 A | 9/2018 |
| EP | 1075166 A2 | 2/2001 |
| JP | 2001075503 A | 3/2001 |
| JP | 2003157028 A | 5/2003 |
| JP | 2005309193 A | 11/2005 |
| JP | 2008051959 A | 3/2008 |
| JP | 2012032471 A | 2/2012 |
| JP | 2015207409 A | 11/2015 |
| WO | 2019033553 A | 2/2019 |

OTHER PUBLICATIONS

Office Action of CN Patent Application No. 2018-11290641.X dated Aug. 4, 2021.
International Search Report of International Application No. PCT/CN2019/079930.

* cited by examiner

DISPLAY SCREENS AND DISPLAY TERMINALS

CROSS-REFERENCE OF RELATED APPLICATION

This application is a continuation under 35 U.S.C. § 120 of international patent application PCT/CN2019/079930, entitled "DISPLAY PANELS AND DISPLAY TERMINALS" filed on Mar. 27, 2019, which claims priority from China Patent Application No. 201811290641.X, filed on Oct. 31, 2018 in the China National Intellectual Property Administration, the entire contents of both are hereby incorporated by reference.

TECHNICAL FIELD

The present disclosure relates to the field of display technology.

BACKGROUND

With the rapid development of electronic devices, users have higher and higher requirements on the screen ratio, and the full screen display of electronic devices has attracted more and more attention from the industry. Conventional electronic devices such as mobile phones, tablet computers and the like require to integrate components such as front cameras, earpieces, infrared sensing elements, and the like, so that cameras, earpieces, infrared sensing elements and the like can be disposed in a notched area by notching on the display screen. However, the notched area is not used to display images, such as the "bang screen" in the prior art. Alternative, the method of opening a hole on the screen can also be used, in which external light can pass through the opening of the screen into the photosensitive element located below the screen for electronic devices implementing the camera function. However, these electronic devices are not a true full-screen, and cannot display in various areas of the whole screen, for example, images cannot be displayed in the camera area.

SUMMARY

The present disclosure provides a display screen, which includes a first display area and a second display area that are adjacent to each other. At least a portion of the first display area is connected to the second display area. The display screen further includes a first display panel disposed in the first display area and a second display panel disposed in the second display area. The first display panel includes a first substrate, a first electrode layer formed on the first substrate, a first pixel definition layer formed on the first electrode layer, a second electrode layer formed on the first pixel definition layer, and a plurality of electrode lead-out wires configured to lead out the plurality of first electrodes. The first electrode layer includes a plurality of first electrodes, at least one end of one of the plurality of the first electrodes is adjacent to the second display panel. The second electrode layer includes a plurality of second electrodes, the plurality of second electrodes respectively intersect across the plurality of first electrodes. The plurality of electrode lead-out wires are respectively connected to the plurality of first electrodes, and respectively extend in parallel with the plurality of second electrodes in the same direction.

In one of the embodiments, the plurality of electrode lead-out wires are disposed below the first pixel definition layer and between the first electrode layer and the first substrate. A signal shielding layer is provided between the plurality of electrode lead-out wires and the first electrode layer.

In one of the embodiments, the signal shielding layer is overlaid on the plurality of electrode lead-out wires. The signal shielding layer is provided with an opening. The first electrode layer is formed on the signal shielding layer. A conductive material is formed in the opening to connect the first electrode layer and the plurality of electrode lead-out wires.

In one of the embodiments, the plurality of electrode lead-out wires are disposed below the first pixel definition layer and above the first electrode layer. A signal shielding layer is provided between the plurality of electrode lead-out wires and the first electrode layer.

In one of the embodiments, the first display area includes a first sub-display area and a second sub-display area adjacent to each other. A photosensitive device is disposed below the first sub-display area. The first pixel definition layer includes a light-transmitting first pixel definition layer corresponding to the first sub-display area. The light-transmitting first pixel definition layer is made of a light-transmitting material.

In one of the embodiments, the first pixel definition layer further includes a light-blocking first pixel definition layer corresponding to the second sub-display area. The light-blocking first pixel definition layer is made of an opaque material.

In one of the embodiments, the first display panel is a passive matrix organic light-emitting diode (PMOLED) display panel. The plurality of first electrodes have a shape of a plurality of intersecting arcs. The plurality of first electrodes extend in parallel in the same direction. Adjacent first electrodes have a spacing therebetween. In an extending direction of the plurality of first electrodes, a width of each of the plurality of first electrodes changes continuously or intermittently, and the spacing changes continuously or intermittently.

In one of the embodiments, the plurality of second electrodes have a shape of a plurality of intersecting arcs. The plurality of second electrodes extend in parallel in the same direction. Adjacent second electrodes have a spacing therebetween. In an extending direction of the plurality of second electrodes, a width of each of the plurality of second electrodes changes continuously or intermittently, and the spacing changes continuously or intermittently.

In one of the embodiments, side edges of the plurality of electrode lead-out wires are provided in a plurality of intersecting arcs. The plurality of electrode lead-out wires extend in parallel in the same direction. Adjacent electrode lead-out wires have a spacing therebetween. In an extending direction of the plurality of electrode lead-out wires, widths of the plurality of electrode lead-out wires change continuously or intermittently, and the spacing changes continuously or intermittently.

In one of the embodiments, a plurality of pixel openings are formed on the first pixel definition layer. Each of the plurality of pixel openings has a shape of one of a circle, an ellipse, a dumbbell, or a gourd.

In one of the embodiments, orthographic projections of the plurality of electrode lead-out wires on the first substrate and orthographic projections of the plurality of second electrodes on the first substrate are staggered from each other.

The present disclosure further provides a display screen, which includes a first display area and a second display area that are adjacent to each other. At least a portion of the first display area is connected to the second display area. The display screen further includes a first display panel disposed in the first display area and a second display panel disposed in the second display area. The first display area has a plurality of display sub-areas. Each of the plurality of display sub-areas is provided with a plurality of sub-display panels. Each of the plurality of sub-display panels includes a first substrate, a first electrode layer formed on the first substrate, a first pixel definition layer formed on the first electrode layer, and a second electrode layer formed on the first pixel definition layer. The first electrode layer includes a plurality of first electrodes, at least one end of one of the plurality of first electrodes is adjacent to the second display panel. The second electrode layer includes a plurality of second electrodes. Each of the plurality of sub-display panels is independently driven.

In one of the embodiments, the first display panel is a PMOLED display panel. The second electrode layer includes a plurality of second electrodes. The plurality of second electrodes respectively intersect across the plurality of first electrodes. The first display panel further includes a plurality of electrode lead-out wires configured to lead out the first electrodes. Each of the first electrodes in at least one of the plurality of display sub-areas is provided with one of the plurality of electrode lead-out wires. The plurality of electrode lead-out wires are respectively connected to the plurality of first electrodes. The plurality of electrode lead-out wires and the plurality of second electrodes in the same display sub-area extend in parallel in the same direction.

In one of the embodiments, the display screen includes three or more display sub-areas. Each of the display sub-areas is connected in sequence. The plurality of second electrodes of each of the display sub-areas are parallel to and spaced apart from each other. At least each of the plurality of first electrodes in one of the display sub-areas between adjacent two display sub-areas is provided with at least one of the plurality of the electrode lead-out wires.

In one of the embodiments, the plurality of electrode lead-out wires are disposed below the first pixel definition layer and between the first electrode layer and the first substrate. A signal shielding layer is provided between the plurality of electrode lead-out wires and the first electrode layer.

In one of the embodiments, the plurality of electrode lead-out wires are disposed below the first pixel definition layer and above the first electrode layer. A signal shielding layer is provided between the plurality of electrode lead-out wires and the first electrode layer.

In one of the embodiments, the first display area includes a first sub-display area and a second sub-display area that are adjacent to each other. A photosensitive device is disposed below the first sub-display area. The first pixel definition layer includes a light-transmitting first pixel definition layer corresponding to the first sub-display area. The light-transmitting first pixel definition layer is made of a light-transmitting material.

In one of the embodiments, the first pixel definition layer further includes a light-blocking first pixel definition layer corresponding to the second sub-display area. The light-blocking first pixel definition layer is made of an opaque material.

In one of the embodiments, the first display panel is an active-matrix organic light-emitting diode (AMOLED) display panel or an AMOLED-like display panel.

The AMOLED-like display panel includes a plurality of pixel circuits disposed on the first substrate. The plurality of pixel circuits are provided with the first electrode layer thereon. Each of the plurality of the pixel circuits includes one switching device.

The first pixel definition layer has a plurality of pixel openings. Each of the plurality of the pixel openings is provided with a light-emitting structure therein. Each of the plurality of first electrodes corresponds to one light-emitting structure. Each of the plurality of first electrodes has a shape of one of a circular, an ellipse, a dumbbell, or a gourd.

The present disclosure further provides a display terminal, which includes a device body having a notched area and a display screen as described above covering on the device body. The notched area is located below the first display area. The notched area is provided with a photosensitive device to collect light through the first display area.

The details of one or more embodiments of the present disclosure are set forth in the accompanying drawings and description below. Other features, objects and advantages of the present disclosure will become apparent according to the description of the specification, the accompanying drawings, and the claims.

BRIEF DESCRIPTION OF THE DRAWINGS

In order to better describe and illustrate embodiments and or examples of the present disclosure, reference may be made to one or more accompanying drawings. The additional details or examples used to describe the accompanying drawings are not to be construed as limiting the scope of any of the disclosed disclosure, the presently described embodiments and examples, and the presently understood preferred mode of the disclosures.

DETAILED DESCRIPTION

Figure 1:
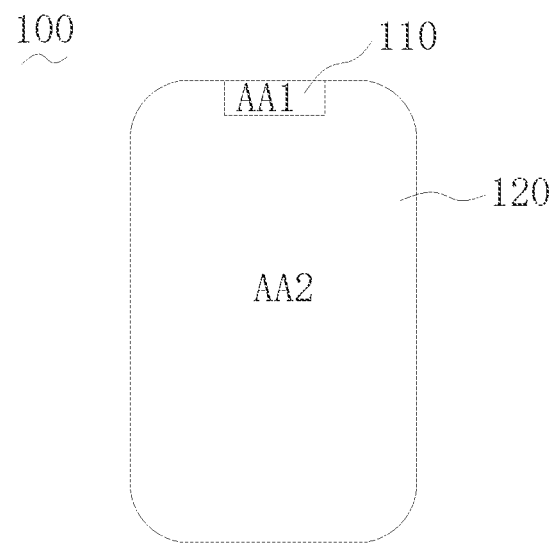
FIG. 1 is a schematic view of a display screen according to an embodiment.

Embodiments of the present disclosure will be described in detail below with reference to the accompanying drawings, so that the above objects, features and advantages of the present disclosure can be more apparent and understandable. Numerous specific details are set forth in the following description in order to provide a thorough understanding of the present disclosure. However, the present disclosure can be implemented in many other ways different from those described herein, and a person skilled in the art can make similar modifications without departing from the present disclosure, and therefore, the present disclosure is not limited by the specific embodiments disclosed below.

It should be understood that when an element is defined as "fixed to" another element, it is either directly on an element or indirectly on an element with a mediating element. When an element is considered to be "connected" to another element, it can be directly connected to another element or indirectly connected to another element with a mediating element.

All technical and scientific terms used herein have the same meaning as commonly understood by one of ordinary skill in the art to which this disclosure applies, unless otherwise defined. The terms used in the specification of present disclosure herein are for the purpose of describing specific embodiments only and are not intended to limit the present disclosure. The term "and/or" used herein includes any and all combinations of one or more of the associated listed items.

In the case of using "include", "have", and "contain" described herein, unless explicitly defined terms such as "only", "consist of", or the like are used, another component may be added. Unless mentioned to the contrary, singular terms may include plural forms and cannot be construed as being one in number.

The PMOLED (Passive matrix organic light-emitting diode) is in a matrix shape simply formed by a cathode and an anode, and pixels in the array are lightened in a scanning manner, each pixel is operated in a short pulse mode, and emits light instantly with high brightness, which has the advantages of simple structure and capability of effectively reducing manufacturing cost and the like. Therefore, the PMOLED display screen with high transparency can be used for transparent display, and other areas are still AMOLED (Active-matrix organic light-emitting diode) display screens for ensuring the display effect. If lead-out wires of the PMOLED is still led out from the side edge of the PMOLED, the width of the side edge of the PMOLED or the width of a bonding interface between the PMOLED and AMOLED is increased, thereby affecting the display effect.

Aiming at the problem that the display effect is affected by increasing the width of the side edge of the PMOLED or increasing the width of the bonding interface between the PMOLED and the AMOLED because the lead-out wires of the PMOLED in the notched area is led out from the side edge of the PMOLED, a display screen and a display terminal which can improve the display effect are provided.

For convenience of description, the accompanying drawings only show structures related to the embodiments of the present disclosure.

FIG. 1 is a schematic view of sub-areas of a display screen according to an embodiment. Referring to FIG. 1, the present disclosure provides a display screen 100 according to an embodiment. The display screen 100 includes a first display area AA1 and a second display area AA2 that are adjacent to each other.

At least a portion of the first display area AA1 is connected to the second display area AA2. The first display area AA1 and the second display area AA2 are both configured to display images. The first display area AA1 may have a shape of a circle, an ellipse, a rectangle, or other irregular shape. In an embodiment, the first display area AA1 may be disposed at a top middle area of the display screen, and the first display area AA1 has a rectangular shape, such that there is three-sided contact with the second display area AA2, as shown in FIG. 1. The first display area AA1 may also be disposed in the middle area of the left-half of the second display area AA2 or the middle area of the right-half of the second display area AA2. In another embodiment, the first display area AA1 may also be disposed inside the second display area AA2, so that the first display area AA1 is completely surrounded by the second display area AA2. In FIG. 1, the number of the second display area AA2 and the number of the first display area AA1 are both one. In other embodiments, the number of the second display area AA2 and the number of the first display area AA1 may be two or more. The second display area AA2 and the first display area AA1 are both configured to display images.

Figure 2:
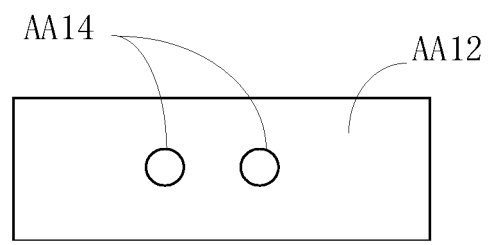
FIG. 2 is a schematic view of a first display area according to an embodiment.

FIG. 2 is a schematic view of the first display area AA1 according to an embodiment, which shows the sub-areas of the first display area AA1. In an embodiment, the first display area AA1 includes a first sub-display area AA12 and a second sub-display area AA14, as shown in FIG. 2. A photosensitive device may be disposed below the second sub-display area AA14. In this embodiment, the number of the second sub-display areas AA14 is two, and the two sub-display areas AA14 are surrounded by the first sub-display area AA12. In other embodiments, the number of the second sub-display areas AA14 may also be one. The number of the second sub-display areas AA14 can be determined according to the position arrangement of the photosensitive device in the display terminal. For example, when the front camera of the display terminal adopts a dual camera, two second sub-display areas AA14 may be provided, and each of the second sub-display areas AA14 corresponds to one camera.

With continued reference to FIG. 1, in an embodiment, the display screen 100 includes a first display panel 110 and a second display panel 120. The first display panel 110 is disposed in the first display area AA1. The second display panel 120 is disposed in the second display area AA2. The first display panel 110 and the second display panel 120 may be manufactured separately, or may be manufactured simultaneously to form an integrated screen.

In an embodiment, the first display panel 110 is a PMOLED display panel, and the second display panel 120 is an AMOLED display panel.

The PMOLED is in a matrix shape simply formed by a cathode and an anode, and pixels in the array are lightened in a scanning manner. Each pixel is operated in a short pulse mode and emits light instantly with high brightness. The advantages are simple structure and the capability of effectively reducing manufacturing costs.

Figure 3:
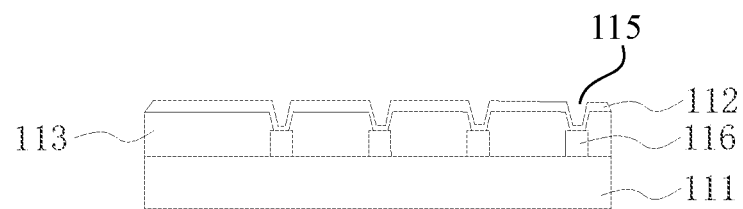
FIG. 3 is a cross-sectional view of a first display panel according to an embodiment.
Figure 4:
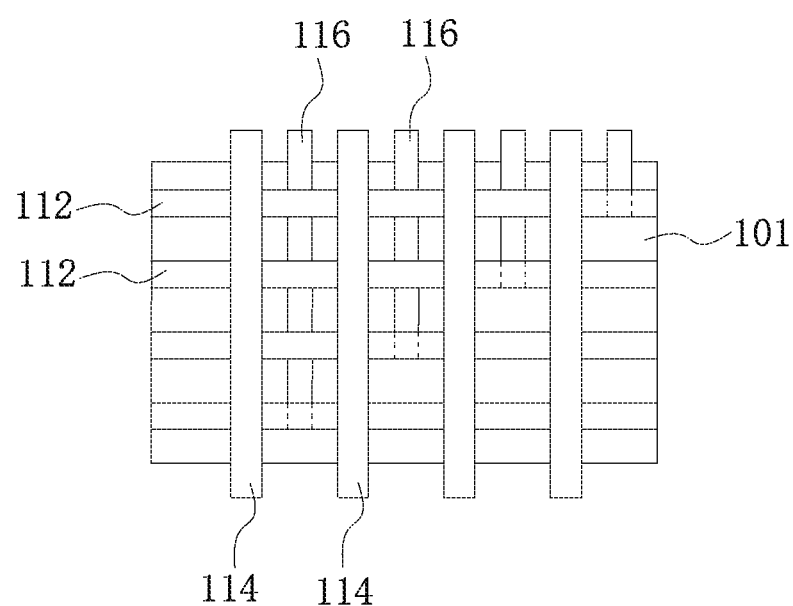
FIG. 4 is a top plan view of a first display panel according to an embodiment.

Specifically, referring to FIGS. 3 to 4, FIG. 3 is a cross-sectional view of a first display panel 110 according to an embodiment, and FIG. 4 is a top plan view of a first display panel according to an embodiment. The first display panel 110 includes a first substrate 111, a first electrode layer (i.e., a layer where a plurality of first electrodes 112 is located) formed on the first substrate 11, a first pixel definition layer (not shown) formed on the first electrode layer, a second electrode layer (i.e., a layer where a plurality of second electrodes 114 are located) formed on the first pixel definition layer, and a plurality of electrode lead-out wires 116.

The AMOLED has a thin film transistor (TFT) array substrate, each pixel is controlled by using an independent thin film transistor, can be driven continuously and independently to emit light and can be driven by low-temperature polysilicon or oxide TFT, which has the advantages of low driving voltage and long service life of light-emitting components.

Specifically, the second display panel 120 includes a second substrate and a TFT array (not shown), a second pixel definition layer (not shown), an anode (not shown), a light-emitting structure (not shown), and a cathode formed sequentially on the second substrate to form an AMOLED display panel. The anode of the second display panel 120 is provided in a one-to-one correspondence with the thin film transistor and the light-emitting structure of the TFT array, and the cathode of the second display panel 120 may be a surface electrode. The second pixel definition layer is made of an opaque material to ensure that data lines of the second display panel 120 are invisible, thereby improving the visual effect of the display screen.

The anode of the AMOLED display panel is generally patterned and formed corresponding to each sub-pixel, and the cathode of the AMOLED display panel is generally an entire surface electrode covering the entire TFT array substrate provided with a plurality of sub-pixels. The TFT array substrate may include a substrate, a buffer layer, a thin film transistor, and other structures.

As described in the background and the foregoing, unlike the AMOLED display panel, the anode and the cathode of the PMOLED display panel are generally strip-shaped, that is, the first display panel 110 of the first display area AA1 includes a plurality of anode strips and a plurality of cathode strips intersecting each other, and a sub-pixel is formed at a position where the anode strip and the cathode strip overlap. Therefore, the three sides of the PMOLED display panel are in contact with the AMOLED display panel, and an electrode lead-out wire in the anode strip or the cathode strip of the PMOLED display panel is necessarily led out from the edge connected to the AMOLED display panel, which inevitably leads to an increase in the width of the side edge of the PMOLED or an increase in the width of the bonding interface between PMOLED and AMOLED.

Therefore, the present disclosure proposes a method for adding an electrode lead-out wire, and the electrode lead-out wire required to be led out from the edge connected to the AMOLED display panel is led out from the edge of the PMOLED display panel that is not connected to the AMOLED display panel.

Furthermore, considering that the cathode is located above and does not need to be led out, and that the anode strip is located below the cathode strip (the "below" in the present disclosure refers to a direction adjacent to the substrate, the "above" refers to a direction away from the substrate, the same below), and that there are more functional film layers below the anode strip, such as a passivation layer, a signal shielding layer, etc., these functional film layers provide advantages for the arrangement of the electrode lead-out wire.

With continued reference to FIG. 3, in this embodiment, only the structural layers involved are shown, while other layers are omitted or simplified. The first display panel 110 includes a first substrate 111, a first electrode layer (i.e., a layer where a plurality of first electrodes 112 is located) formed on the first substrate 111, a first pixel definition layer (not shown) formed on the first electrode layer, a second electrode layer (i.e., a layer where a plurality of second electrodes 114 are located) formed on the first pixel definition layer, and a plurality of electrode lead-out wires 116 configured to lead out a plurality of first electrodes 112. The first electrode layer includes a plurality of first electrodes 112, and the second electrode layer includes a plurality of second electrodes 114. The plurality of electrode lead-out wires 116 are respectively connected to the plurality of first electrodes 112, and respectively extend in parallel with the plurality of second electrodes 114 in the same direction.

With continued reference to FIGS. 1, 3, and 4, at least one end of the first electrode 112 is adjacent to the second display panel 120. The plurality of second electrodes 114 are disposed to intersect across the plurality of first electrodes 112.

The first display panel 110 further includes a plurality of electrode lead-out wires 116 configured to lead out the plurality of first electrodes 112, each of the electrode lead-out wires 116 is connected to each of the first electrodes 112, and each of the electrode lead-out wires 116 extends in parallel with each of the second electrodes 114 in the same direction, respectively. The aforementioned display screen 100 has the first display area AA1 and the second display area AA2 both configured to display images, and can truly realize full-screen display. In this way, each of electrode lead-out wires 116 and each of the second electrodes 114 extend in parallel in the same direction, and thus can be led out from the same side edge of the first display panel 110. Compared with the conventional solution that the first electrode 112 and the second electrode 114 are led out from respective edges, the width of the frame at one side edge of the first display panel 110 can be at least reduced to avoid the problem of increasing the width of the side edge of the first display panel, thereby increasing the area of the display area and improving the display effect of the display screen.

For example, in the example shown in FIG. 1, when the first display panel 110 is a PMOLED display panel and the second display panel 120 is an AMOLED display panel, the electrode lead-out wire 116 is led out from the edge of the PMOLED display panel that is not connected to the AMOLED display panel. It is understood that the first substrate and the second substrate may be the same substrate.

As shown in FIG. 4, the plurality of the first electrodes 112 extend in parallel in the same direction, and adjacent two first electrodes 112 have a spacing therebetween. The plurality of second electrodes 114 extend in parallel in the same direction, and adjacent two second electrodes 114 have a spacing therebetween. In addition, the plurality of the electrode lead-out wires 116 extend in parallel in the same direction, and adjacent two electrode lead-out wires 114 have a spacing therebetween.

Figure 5:
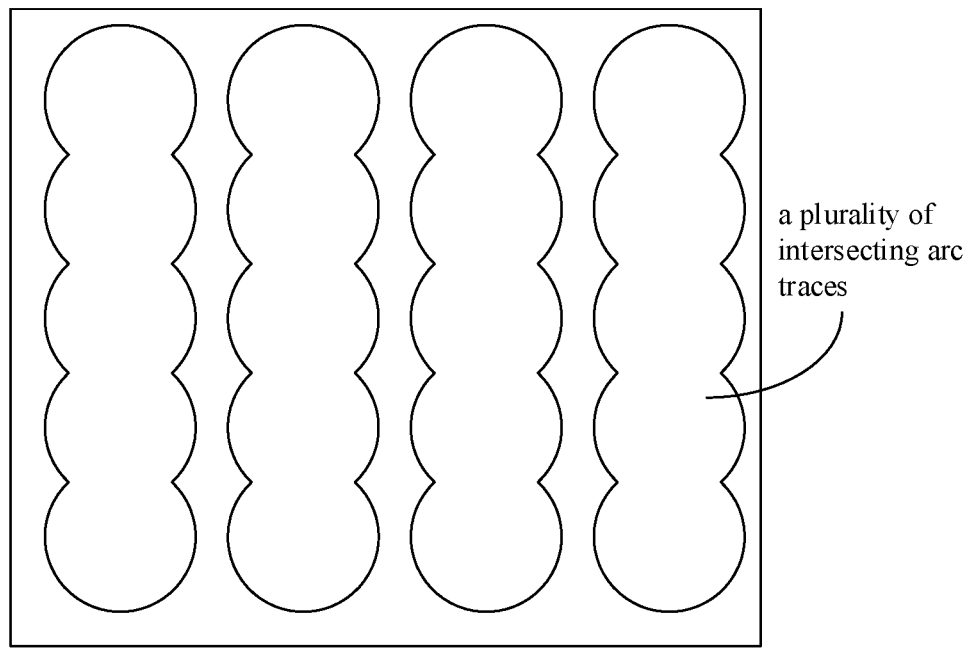
FIG. 5 is a schematic view of a second electrode of a first display panel according to an embodiment.

FIG. 5 is a schematic view of a second electrode of a first display panel according to an embodiment. In an embodiment, side edges of one or more of the first electrodes 112, the second electrodes 114, and the electrode lead-out wires 116 are provided in a plurality of intersecting arcs. Specifically, in extending directions of the plurality of intersecting arc traces, the widths of the plurality of intersecting arc traces change continuously or intermittently, and the spacing changes continuously or intermittently. The continuous change of width means that the widths at any adjacent two positions on the plurality of intersecting arc traces are different. The intermittent change of width means that in the plurality of intersecting arc traces, the widths of adjacent two positions in some areas are the same, while the widths of adjacent two positions in some areas are different.

By providing side edges of one or more of the first electrodes 112, the second electrodes 114, and the electrode lead-out wires 116 in the first display panel 110 as a plurality of intersecting arc traces, when the external light passes through the signal traces, the positions of diffraction fringes generated at different positions of the plurality of intersecting arc traces are different. The diffraction fringes at different positions are counteracted with each other, so that the diffraction effect can be effectively weakened, and the photographed graph has higher definition when the camera is disposed below the first display panel 110 can be further ensured.

In an embodiment, the first electrode layer may be an anode.

With continued reference to FIG. 3, the electrode lead-out wires 116 are disposed on the first substrate 111. In an embodiment, a signal shielding layer 113 is disposed on the electrode lead-out wires 116 and covers the electrode lead-out wires 116. The first electrode layer is formed on the signal shielding layer 113. The first pixel definition layer is formed on the first electrode layer. Specifically, the electrode lead-out wires 116 are disposed below the first pixel definition layer, and avoid an area where a photosensitive device such as a camera is located. By disposing the electrode lead-out wires 116 below the first pixel definition layer and avoiding the area where the camera is located, the interference of the electrode lead-out wires 116 to the light-emitting area and the normal operation of the camera can be avoided. Furthermore, by forming the signal shielding layer 113 between the electrode lead-out wires 116 and the first electrode layer, it can be ensured that the electrode lead-out wires 116 do not generate a signal interference with the first electrode layer.

In an embodiment, the electrode lead-out wires 116 are located between the first electrode layer and the first substrate 111. That is, the electrode lead-out wires 116 are prepared prior to the first electrode layer. In addition, the electrode lead-out wires 116 are disposed below the first electrode layer, so that the influence on the operation of the first electrode layer can be reduced. At this case, the first electrode layer is an anode layer. In another embodiment, the electrode lead-out wires 116 may also be disposed above the first electrode layer and below the first pixel definition layer.

Specifically, when the signal shielding layer 113 is disposed between the electrode lead-out wires 116 and the first electrodes 112, the signal shielding layer 113 is overlaid on the electrode lead-out wires 116, and the signal shielding layer 113 is provided with openings 115, the first electrodes 112 are formed on the signal shielding layer 113, and materials of the first electrodes 112 are formed in the openings 115 to connect the first electrodes 112 and the electrode lead-out wires 116.

When the electrode lead-out wires 116 are disposed above the first electrode layer, the first electrode layer is a cathode layer, so as to prevent the electrode lead-out wires 116 from interfering with the normal operation thereof.

In an embodiment, the first substrate 111 includes a glass substrate and a flexible substrate formed over the glass substrate. By additionally providing the flexible substrate, the first substrate can be ensured to have a certain bending performance.

In an embodiment, the first pixel definition layer includes a light-blocking first pixel definition layer corresponding to the first sub-display area AA12. The light-blocking first pixel definition layer may be made of an opaque material (such as light-blocking or light-absorbing material, like black organic glue, etc.). Since the first sub-display area AA12 does not need to be provided with a camera, the requirement for light transmittance is relatively low in this area. In addition, the first pixel definition layer further includes a light-transmitting first pixel definition layer corresponding to the second sub-display area AA14. The light-transmitting first pixel definition layer is made of a light-transmitting material. At this case, the electrode lead-out wires 116 are made of metal or a transparent metal oxide material. For example, when the electrode lead-out wires 116 are made of the transparent metal oxide, indium tin oxide (ITO), indium zinc oxide (IZO), silver-doped indium tin oxide (Ag+ITO), silver-doped indium zinc oxide (Ag+IZO), or the like can be used. By configuring the light-blocking first pixel definition layer of the first sub-display area AA12 to be opaque, a certain light transmittance of the panel is sacrificed to ensure that the electrode lead-out wires 116 passing through the first sub-display area AA12 is invisible, thereby improving the display effect of the display screen.

Figure 6:
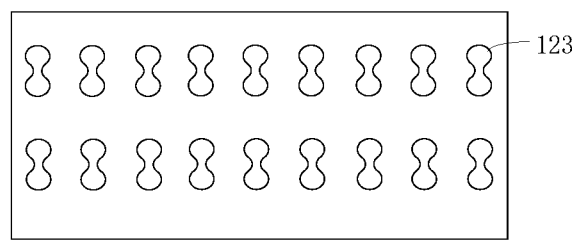
FIG. 6 is a schematic view of pixel openings in a first pixel definition layer according to an embodiment.

FIG. 6 is a schematic view of pixel openings 123 in a first pixel definition layer of a first display panel 110 according to an embodiment. In an embodiment, the first pixel definition layer has the pixel openings 123 formed therein. Each of the pixel openings 123 of the first pixel definition layer corresponds to one light-emitting structure. Each of the pixel openings 123 has a shape of one of a circle, an ellipse, a dumbbell, or a gourd, and specifically, as shown in FIG. 6, the pixel opening 123 has a shape of a dumbbell. By arranging each sub-pixel to have a shape of one of a circle, an ellipse, a dumbbell, or a gourd, when external light passes through the light-emitting structure, the positions of the diffraction fringes generated at different positions of the sub-pixels are different. The diffraction fringes at different positions are counteracted with each other, so that the diffraction effect can be effectively weakened, and the photographed graph has higher definition when the camera is disposed below the first display panel 110 can be further ensured. In addition, can maximize the area of each of the sub-pixels can be enlarged to the maximum extent by the shape of a circle, an ellipse, a dumbbell or a gourd to further increase the light transmittance.

The solution of providing the electrode lead-out wires 116 according to the present disclosure can be applied in a PMOLED display panel, and can also be used for a composite screen of a PMOLED display panel and an AMOLED display panel. The display screen 100 is a composite screen of a PMOLED display panel and an AMOLED display panel, that is, the first display panel 110 of the first display area AA1 is a PMOLED display panel, and the second display panel 120 of the second display area AA2 is an AMOLED display panel. Specifically, in the display screen 100 shown in FIG. 1, the display screen 100 has both an AMOLED display panel and a PMOLED display panel, which is a composite screen of the AMOLED display panel and the PMOLED display panel. Since the PMOLED display panel has no TFT drive array, the light transmittance is high. Therefore, a photosensitive device can be disposed below the PMOLED display panel. When the photosensitive device is working, the photosensitive device can obtain light from the first display area AA1; when the photosensitive device is not working, the first display area AA1 can display an image normally. Therefore, the display effect of the mobile phone can be improved.

Furthermore, when the AMOLED display panel and the PMOLED display panel are both combined, a portion of the edges of the PMOLED display panel is connected to the AMOLED display panel, that is, the PMOLED display panel also has edges that are not connected to the AMOLED display panel.

Specifically, in the display screen 100 shown in FIG. 1, the first display area AA1 is located at the top of the second display area AA2, and the top end of the first display area AA1 is flush with the top end of the second display area AA2. With this arrangement, the first display area AA1 is located at the edge of the entire display screen 100, which can reduce the influence on the display screen effect. Accordingly, the electrode lead-out wires 116 are led out from the top of the first display area AA1.

With continued reference to FIG. 3, the signal shielding layer 113 is formed in the same process step as a passivation layer, an interlayer insulating layer, or a planarization layer of the second display panel 120. In this way, the signal shielding layer 113 can be formed in the same layer, in the same material, and simultaneously when the passivation layer, the interlayer insulating layer, or the planarization layer is formed on the AMOLED display panel, so that there will be no added process, and the thickness and structure of the film layer are not increased.

Furthermore, the electrode lead-out wires 116 are formed in the same process step as a source-drain layer or a gate layer of the second display panel 120, and the light-blocking first pixel definition layer is made of an opaque material. That is to say, the electrode lead-out wires 116 can be formed in the same layer, in the same material, and simultaneously with the source-drain layer or the gate layer in the AMOLED display panel. The light-blocking first pixel-definition layer made of an opaque material can make the electrode lead-out wires 116 invisible, which not only saves the process, but also avoids the increase in film thickness caused by the increase of film layer.

In an embodiment, the first pixel definition layers of the first display area AA1 are all made of light-transmitting materials. At this case, the electrode lead-out wires 116 are made of a transparent metal oxide material. By setting the first pixel definition layer of the first display area AA1 as a light-transmitting material, it is possible to ensure that the display screen has a good light transmittance and ensure the normal operation of the photosensitive device such as a camera disposed below. When the electrode lead-out wires 116 are made of a transparent metal oxide, it can be ensured that the transparency of the display panel is not affected when the second display panel 120 is a transparent display panel.

With continued reference to FIG. 4, furthermore, the electrode lead-out wires 116 are disposed in parallel with the second electrode 114, that is, the extending directions of the electrode lead-out wires 116 are the same as the extending direction of the second electrode 114. In this way, the electrode lead-out wires 116 are led out from the same side as the lead-out edge of the second electrode 114.

Furthermore, orthographic projections of the electrode lead-out wires 116 on the first substrate 111 and orthographic projections of the second electrodes 114 on the first substrate 111 are staggered from each other. Specifically, the orthographic projections of the electrode lead-out wire 116 on the first substrate 111 are located between adjacent two second electrodes 114 or outside the outermost second electrode 114. In this way, the position where the first electrode 112 and the second electrode 114 overlap is avoided, that is, the arrangement of the electrode lead-out wires 116 avoids the sub-pixels, thereby avoiding the problem that the arrangement of the electrode lead-out wires 116 affects the sub-pixels and further affects the display screen 100.

It is worth noting that, since the connection portion between the electrode lead-out wire 116 and the first electrode 112 is provided with the openings 115, the first electrode 112 will sink slightly at the connection portion, which is not conducive to the formation of the sub-pixels. Optionally, the orthographic projections of the electrode lead-out wires 116 on the first substrate 111 are located between adjacent two second electrodes 114. In addition, the width of the PMOLED display panel along the extending direction of the first electrode 112 may not be increased as much as possible. It can be understood that the electrode lead-out wires 116 are uniformly distributed in the area between adjacent two second electrodes 114 or the area outside the outermost second electrode 114 as much as possible, so as to ensure that the arrangement of the electrode lead-out wires 116 does not affect other film layers.

It can be understood that, in some embodiments, more than two electrode lead-out wires 116 may be disposed between adjacent two second electrodes 114. It can be understood that the length of each of the electrode lead-out wires 116 may be set to be different, or the length of a portion of the electrode lead-out wires 116 may be set to be the same. Optionally, the length of each of the electrode lead-out wires 116 is set to be different as much as possible. Optionally, one end of each of the electrode lead-out wires 116 is disposed in alignment, and the other end thereof is configured to connect with the first electrode 112.

Figure 7:
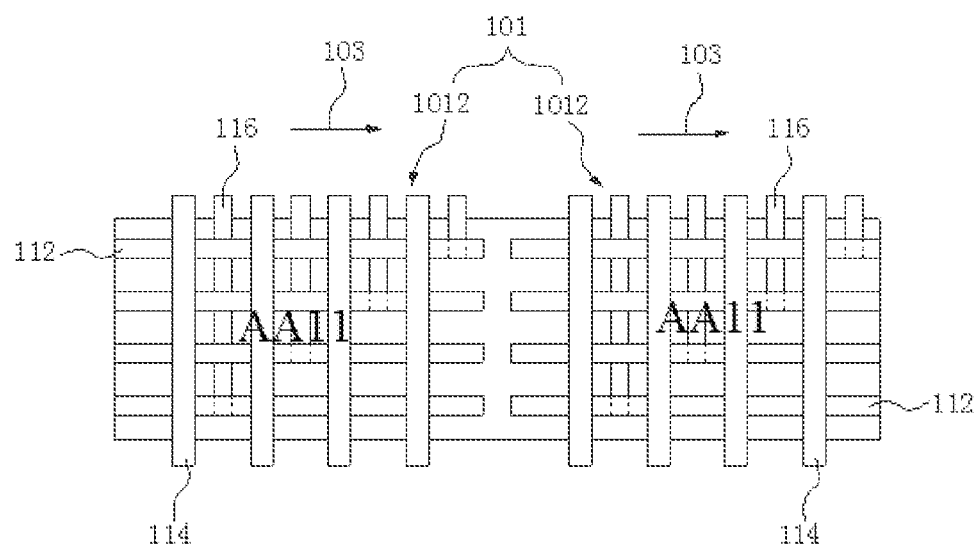
FIG. 7 is a top plan view of each sub-display panel according to an embodiment.
Figure 8:
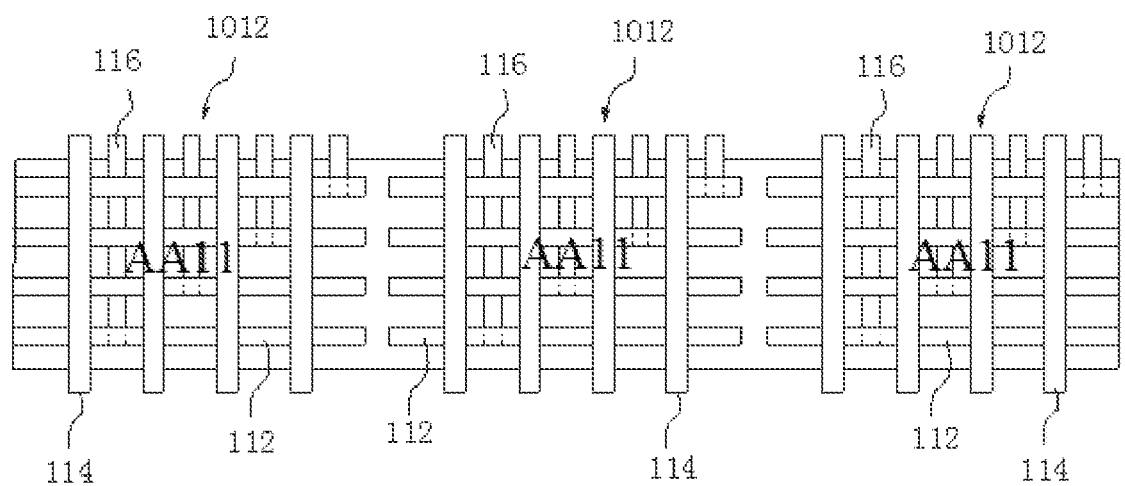
FIG. 8 is a top plan view of each sub-display panel according to another embodiment.

FIGS. 7 to 8 are top plan views of sub-display panels in different embodiments, showing the top view distribution of the first electrodes 112, the second electrodes 114, and the electrode lead-out wires 116 of the sub-display panels 1012 of the first display panel 110. The first display area AA1 of the present disclosure has a plurality of display sub-areas AA11, and each of the display sub-areas AA11 is provided with a sub-display panel 1012. Each of the sub-display panels 1012 includes the first substrate 111, the first electrode layer, the first pixel definition layer, and the second electrode layer described above. The first electrode layer includes a plurality of first electrodes 112, and at least one end of the first electrode 112 is adjacent to the second display panel 120. Each of the sub-display panels 1020 is independently driven.

Specifically, the first electrode layer and the second electrode layer of each of the sub-display panels 1012 are independent from each other, that is, the first electrode layer and the second electrode layer in different sub-display panels 1012 can write signals independently, and the signals can also be written synchronously. In this way, by arranging the first display area AA1 into two or more display sub-areas AA11 and providing the sub-display panels 1012, respectively, each sub-display panel 1012 is scanned according to the scanning direction 103 shown in FIG. 7 during scanning, so that the number of scanning lines can be greatly reduced, and the light-emitting time of each line can be increased by increasing the scanning time of each line, so as to achieve the purpose of improving the brightness of the first display area AA1 without reducing the resolution.

Furthermore, when the first display panel 110 is a PMOLED display panel, the second electrode layer includes a plurality of second electrodes 114. The plurality of second electrodes 114 and the plurality of first electrodes 112 intersect to form one sub-display panel 1012.

Furthermore, at least one sub-display panel 1012 is provided with a plurality of electrode lead-out wires 116, and each of the electrode lead-out wires 116 and each of the second electrodes 114 in the same display sub-area extend in parallel in the same direction. Each of the first electrodes 112 of at least one sub-display panel 1012 is provided with the electrode lead-out wires 116.

With continued reference to FIGS. 7 to 8, in the same sub-display panel 1012, the electrode lead-out wires 116 and the second electrodes 114 are led out from the same side edge of the PMOLED display panel. Compared with the conventional solution that the first electrode 112 and the second electrode 114 are led out from the respective edges, the width of the frame at one side edge of the PMOLED display panel can be at least reduced to avoid the problem of increasing the width of the side edge of the PMOLED display panel, thereby increasing the area of the display area and improving the display effect of the display screen.

In the case that a portion of the edges of the PMOLED display panel is connected to the AMOLED display panel, the first electrode 112 needs to be led out from the edge where the PMOLED display panel is connected to the AMOLED display panel when using the conventional traces, thus the width of the bonding interface between the PMOLED display panel and the AMOLED display panel is inevitably increased. In view of the technical problem, when the electrode lead-out wires 116 are specifically applied to a PMOLED display panel in which a PMOLED display panel and an AMOLED display panel are combined, the same side edge where the electrode lead-out wires 116 and the second electrodes 114 in the same sub-display panel 1012 are led out from the PMOLED display panel is not connected to the AMOLED display panel.

In this way, the width of the bonding interface between the PMOLED display panel and the AMOLED display panel can also be reduced, the problem that the display effect is influenced due to the fact that the width of the bonding interface between the PMOLED and the AMOLED is increased because the electrode lead-out wires 116 need to be led out from the side edge where the PMOLED display panel is connected to the AMOLED display panel can be avoided. Alternatively, the problem that the first electrodes 112 need to be led out through the display area of the AMOLED and further the display effect of the AMOLED is affected can be avoided, so that the area of the display area can be increased and the display effect of the display screen can be improved.

With continued reference to FIG. 7, for example, the first display area AA1 corresponding to the PMOLED display panel is divided into two display sub-areas AA11, the sub-display panels 1012 are respectively provided, and then the two sub-display panels 1012 are scanned according to the scanning direction 103 respectively, so that compared with the original full-screen scanning, the number of scanning lines is reduced by half, and the brightness can be doubled. In order to cooperate with the sub-area scanning, the data lines of the two sub-display panels 1012 are input separately, but the data signals are written synchronously; therefore, the number of input data lines will double.

With continued reference to FIG. 8, similarly, if the first display area AA1 corresponding to the PMOLED display panel is divided into three display sub-areas AA11, the sub-display panels 1012 are provided respectively, and then the three sub-display panels 1012 are scanned separately, so that the brightness can be increased by 3 times as compared with the original full-screen scanning. Meanwhile, the data lines must also be divided into three data lines in the sub-display panels 1012, the data signals of the three sub-display panels 1012 are written synchronously, thus the number of input data lines will become 3 times.

When there are three or more display sub-areas AA11, the sub-display panels 1012 of each of the display sub-areas AA11 are sequentially connected in such a manner that the second electrodes 114 are parallel to each other and spaced apart from each other, and at least the sub-display panel 1012 in the display sub-area AA11 located between adjacent two display sub-areas AA11 is provided with a plurality of electrode lead-out wires 116.

With continued reference to FIG. 8, in some embodiments, when the display screen 100 includes three or more display sub-areas AA11, the sub display panels 1012 of each of the display sub-areas AA11 are connected in sequence, and the second electrodes 114 of each of the sub display panels 1012 are parallel to each other and spaced apart from each other. The aforementioned electrode lead-out wires 116 are respectively disposed below at least each of the first electrodes 112 of the sub-display panel 1012 in the display sub-area AA11 between adjacent two display sub-areas AA11. The arrangement is such that the electrode lead-out wires 116 are led out from the edge of the sub-display panel 1012 that is not connected to other sub-display panels 1012, that is, the electrode lead-out wires 116 in each sub-display panel 1012 are led out from the same side edge of the display screen 100 perpendicular to the second electrode 114. This solves the problem that the leading-out of the first electrode 112 in the middle sub-display panel 1012 needs to pass through the sub-display panels 1012 on both sides to affect the display effect of the AMOLED, and also reduces the width of the bonding interface between the display sub-areas AA11.

It can be understood that in an embodiment, the electrode lead-out wires 116 are provided below each of the first electrodes 112 in each sub-display panel 1012, and each of the electrode lead-out wires 116 is led out from the edge of the located sub-display panel 1012 not connected to other sub-display panels 1012, so that the width of the bonding interface between adjacent two display sub-areas AA11 can be reduced.

Furthermore, each of the electrode lead-out wires 116 in each sub-display panel 1012 is led out from the same side edge of the corresponding sub-display panel 1012; that is, the electrode lead-out wires 116 in each sub-display panel 1012 are led out from the same side edge of the display screen 100. In this way, while reducing the width of the bonding interface between adjacent two display sub-areas AA11, the width of the other edges of the display screen 100 can also be reduced, and only one side edge needs to be left for leading out the electrode lead-out wires 116 and the second electrodes 114, so that it is advantageous for the display screen 100 to achieve a narrow frame.

It can be understood that in another specific example, the plurality of sub-display panels 1012 are connected in sequence, and the first electrodes 112 of the plurality of sub-display panels 1012 are parallel to each other and spaced apart (not shown). At this time, the electrode lead-out wires 116 in each sub-display panel 1012 are optionally led out from the same side edge of the display screen 100 perpendicular to the first electrodes 112. However, in this case, there is no sufficient position for disposing the electrode lead-out wires 116 compared to the aforementioned case.

In some embodiments, the first display panel 110 is an AMOLED-like display panel, and the second display panel 120 is an AMOLED display panel. The AMOLED-like display panel means that the pixel circuit thereof includes only one switching device (that is, driving TFT) without a capacitor structure. The other structures of the AMOLED-like display panel are the same as the AMOLED display panel. Take an example that the first display panel 110 is an AMOLED-like display panel for description.

Figure 9:
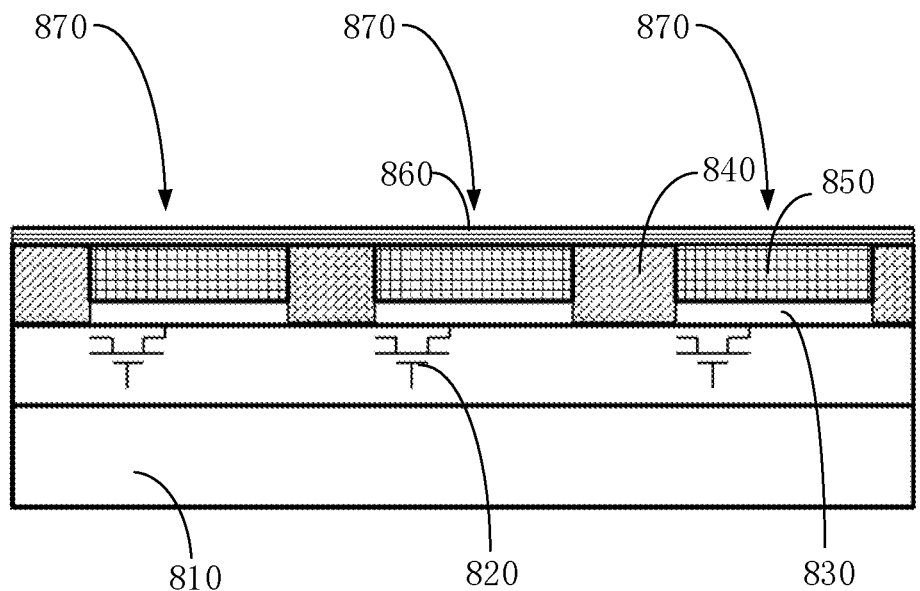
FIG. 9 is a cross-sectional view of a first display panel according to another embodiment.

FIG. 9 is a schematic view of a first display panel according to another embodiment, in which the first display panel is an AMOLED-like display panel. This type of AMOLED display panel includes a first substrate 810 and a plurality of pixel circuits 820 (that is, TFT arrays) disposed on the first substrate 810. The pixel circuit 820 is provided with a first electrode layer thereon. The first electrode layer includes a plurality of first electrodes 830. The first electrodes 830 correspond to the pixel circuits 820 in a one-to-one correspondence. The first electrode 830 here is an anode. The AMOLED-like display panel further includes a pixel definition layer 840, which is disposed on the first electrode 830. The pixel definition layer 840 has a plurality of pixel openings 870, and light-emitting structures 850 are disposed in the pixel openings 870 to form sub-pixels (not shown), which correspond to the first electrodes 830 in a one-to-one correspondence. A second electrode 860 is provided above the light-emitting structure 850, and the second electrode 860 is a cathode, which is a surface electrode, that is, an entire surface electrode formed of electrode material of an entire surface. The pixel circuit 820 is provided with scanning lines, data lines, and TFT switching devices therein. Both the scanning line and the data line are connected to the TFT switching device. The scanning lines control the turning on and off of the TFT switching devices. The data lines supply a driving current to the first electrodes 830 when the pixels are turned on, so as to control the sub-pixels to emit light.

In an embodiment, the first substrate 810 may be a rigid substrate, such as a transparent substrate like a glass substrate, a quartz substrate, or a plastic substrate. The substrate 810 may also be a flexible substrate, such as a polyimide (PI) film and the like, to improve the transparency of the device. The light-emitting structure 850 may be an organic light-emitting diode (OLED).

Figure 10:
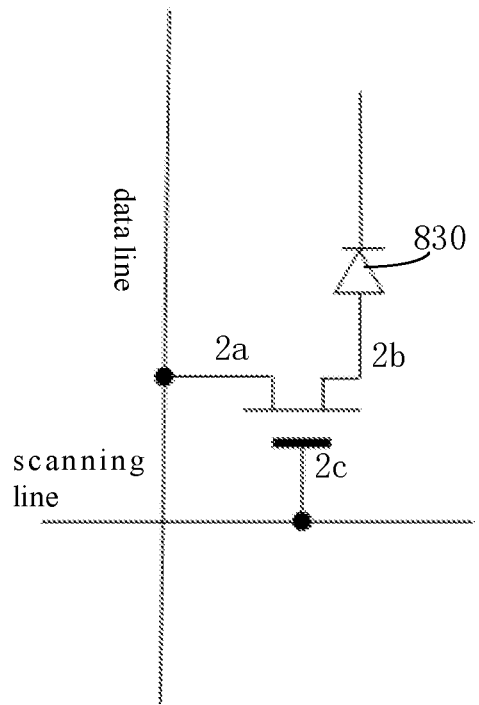
FIG. 10 is a schematic view of a circuit principle of a pixel circuit according to an embodiment.

FIG. 10 is a schematic view of a circuit principle of the pixel circuit 820 according to an embodiment. Unlike the pixel circuit of a conventional AMOLED display panel, the pixel circuit 820 includes only one switching device, and does not include elements such as a storage capacitor, thereby forming a capacitor-less structure. In this embodiment, the pixel circuit 820 includes one switching device. The switching devices are disposed in one-to-one correspondence with the first electrodes 830, that is, one sub-pixel corresponds to one switching device. The switching device includes a first terminal 2a, a second terminal 2b, and a control terminal 2c, as will be described in more detail later. The scanning line is connected to the control terminal 2c of the switching device, the data line is connected to the first terminal 2a of the switching device, and the first electrode 830 is connected to the second terminal 2b of the switching device, as shown in FIG. 8. In the aforementioned pixel circuit 820, the data line is connected to the first terminal 2a of the switching device, and the scanning line is connected to the control terminal 2c of the switching device, so that the number of the switching devices in the pixel circuit 820 can be reduced to one, and the load current of the scanning line and the load current of the data line can be greatly reduced.

The scanning lines in the aforementioned display panel control the turning on and off of the pixel circuits 820, only the switching voltage required by the switching devices in the pixel circuits 820 is needed to be provided, and the current of the light-emitting structure (OLED) is not needed to be input, which greatly reduces the load current of the scanning lines, so that the scanning lines can be made of transparent materials such as indium tin oxide (ITO). Moreover, when the pixel circuit 820 is turned on, the data line supplies a driving current to the anode to control the sub-pixels to emit light. The data line only needs to supply the driving current of one sub-pixel at each time, so that the load of the data line is also small. Therefore, the data lines can also be made of transparent materials such as ITO and the like, thereby improving the light transmittance of the display screen. The surface electrode (cathode) is shared by a plurality of sub-pixels, and the current of a row of sub-pixels is provided by the whole surface cathode at each moment. The requirements for the conductivity of the cathode are greatly reduced, high-transparency electrodes can be adopted to improve the transparency and the integral consistency of the screen, and a negative photoresist is not needed for separating the cathode.

In an embodiment, the first electrode 830 may have a shape of one of a circle, an ellipse, a dumbbell, or a gourd, and particularly, refer to FIG. 6. By providing the first electrode 830 to have a shape of one of a circular, an ellipse, a dumbbell or a gourd, the diffraction effect can also be weakened. In an embodiment, the pixel opening in the pixel definition layer 840 has a shape of one of a circular, an ellipse, a dumbbell, or a gourd, as shown in FIG. 6, so that the diffraction effect can also be weakened. In an embodiment, the signal lines such as the scanning lines and the data lines may have a shape of a plurality of intersecting arc traces, so as to achieve the effect of improving diffraction.

Figure 11:
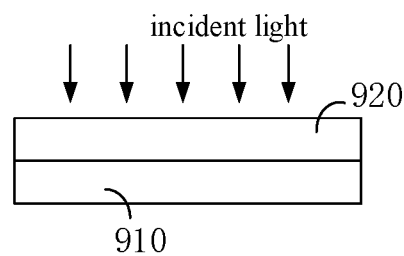
FIG. 11 is a schematic view of a display terminal according to an embodiment.

FIG. 11 is a schematic view of a display terminal according an embodiment. An embodiment of the present disclosure further provides a display terminal. The display terminal includes a device body 910 and a display screen 920. The display screen 920 is disposed on the device body 910 and is connected to the device body 910. The display screen 920 may adopt a display screen in any of the aforementioned embodiments, and is used for displaying images.

Figure 12:
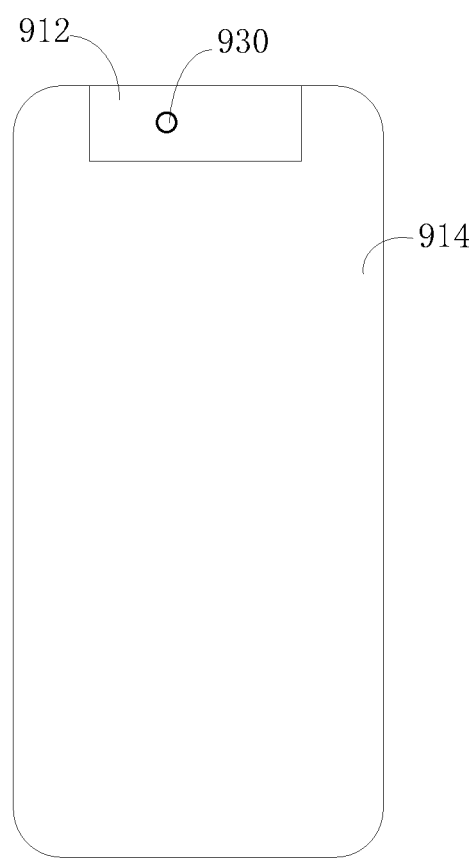
FIG. 12 is a schematic view of a device body according to an embodiment.

FIG. 12 is a schematic view of a device body 910 according to an embodiment. In this embodiment, the device body 910 may be provided with a notched area 912 and a non-notched area 914. The notched area 912 may be provided with photosensitive devices such as a camera 930, an optical sensor and the like therein. At this time, the first display area AA1 of the display screen 920 is attached to the notched area 912 correspondingly, so that the aforementioned photosensitive devices such as a camera 930, an optical sensor and the like can perform operations such as external light collection and the like through the first display area AA1.

In an embodiment, in order to increase the light transmittance, the first display area AA1 may not be provided with a polarizer, that is, no polarizer is disposed in the first display panel 110. In addition, the first display panel 110 in the first display area AA1 can effectively improve the diffraction phenomenon generated by the transmission of the external light through the first display area AA1, thereby effectively improving the quality of the image captured by the camera 930 on the display terminal, and avoiding distortion of the captured images due to diffraction, while also improving the accuracy and sensitivity of the optical sensor for sensing external light.

The above display terminal may be a digital device such as a mobile phone, a tablet computer, a palmtop computer, an ipad and the like.

The technical features of the embodiments described above may be arbitrarily combined. For the sake of brevity of description, not all possible combinations of the technical features in the aforementioned embodiments are described. However, as long as there is no contradiction between the combinations of these technical features, all should be considered as the scope of this specification.

The aforementioned embodiments merely illustrate several embodiments of the present disclosure, and the description thereof is specific and detailed, but it shall not be constructed as limiting the scope of the present disclosure. It should be noted that, for a person who is skill in the art, several variations and improvements may be made without departing from the concept of the present disclosure, and these are all within the protection scope of the present disclosure. Therefore, the protection scope of the present disclosure shall be subject to the appended claims.

What is claimed is:

1. A display screen comprising:
   a first display area and a second display area adjacent to each other, at least a portion of the first display area being connected to the second display area; and
   a first display panel disposed in the first display area and a second display panel disposed in the second display area;
   wherein the first display panel comprises:
   a first substrate;
   a first electrode layer formed on the first substrate, the first electrode layer comprising a plurality of first electrodes, at least one end of one of the plurality of the first electrodes being adjacent to the second display panel;
   a first pixel definition layer formed on the first electrode layer;
   a second electrode layer formed on the first pixel definition layer, the second electrode layer comprising a plurality of second electrodes, the plurality of second electrodes respectively intersecting across the plurality of first electrodes; and
   a plurality of electrode lead-out wires configured to lead out the plurality of first electrodes, the plurality of electrode lead-out wires being respectively connected to the plurality of first electrodes, and respectively extending in parallel with the plurality of second electrodes in the same direction;
   wherein orthographic projections of the plurality of electrode lead-out wires on the first substrate and orthographic projections of the plurality of second electrodes on the first substrate are staggered from each other.

2. The display screen according to claim 1, wherein the plurality of electrode lead-out wires is disposed below the first pixel definition layer and between the first electrode layer and the first substrate, and a signal shielding layer is provided between the plurality of electrode lead-out wires and the first electrode layer.

3. The display screen according to claim 2, wherein the signal shielding layer is overlaid on the plurality of electrode lead-out wires, the signal shielding layer is provided with an opening, the first electrode layer is formed on the signal shielding layer, and a conductive material is formed in the opening to connect the first electrode layer and the plurality of electrode lead-out wires.

4. The display screen according to claim 2, wherein the first display area comprises a first sub-display area and a second sub-display area adjacent to each other, a photosensitive device is disposed below the first sub-display area, and the first pixel definition layer comprises a light-transmitting first pixel definition layer corresponding to the first sub-display area, and the light-transmitting first pixel definition layer is made of a light-transmitting material.

5. The display screen according to claim 4, wherein the first pixel definition layer further comprises a light-blocking first pixel definition layer corresponding to the second sub-display area, and the light-blocking first pixel definition layer is made of an opaque material.

6. The display screen according to claim 1, wherein the plurality of electrode lead-out wires is disposed below the first pixel definition layer and above the first electrode layer, and a signal shielding layer is provided between the plurality of electrode lead-out wires and the first electrode layer.

7. The display screen according to claim 1, wherein the first display panel is a passive matrix organic light-emitting diode (PMOLED) display panel, the plurality of first electrodes have a shape of a plurality of intersecting arcs, the plurality of first electrodes extend in parallel in the same direction, and adjacent first electrodes have a spacing therebetween; in an extending direction of the plurality of first electrodes, a width of each of the plurality of first electrodes changes continuously or intermittently, and the spacing changes continuously or intermittently.

8. The display screen according to claim 1, wherein the plurality of second electrodes have a shape of a plurality of intersecting arcs, the plurality of second electrodes extend in parallel in the same direction, and adjacent second electrodes have a spacing therebetween; in an extending direction of the plurality of second electrodes, a width of each of the plurality of second electrodes changes continuously or intermittently, and the spacing changes continuously or intermittently.

9. The display screen according to claim 1, wherein side edges of the plurality of electrode lead-out wires are provided in a plurality of intersecting arcs, the plurality of electrode lead-out wires extend in parallel in the same direction, and adjacent electrode lead-out wires have a spacing therebetween; in an extending direction of the plurality of electrode lead-out wires, a width of one of the plurality of electrode lead-out wires changes continuously or intermittently, and the spacing changes continuously or intermittently.

10. The display screen according to claim 1, wherein the first pixel definition layer is provided with a plurality of pixel openings thereon, and each of the plurality of pixel openings has a shape of one of a circle, an ellipse, a dumbbell, or a gourd.

11. A display screen comprising:
    a first display area and a second display area adjacent to each other, at least a portion of the first display area being connected to the second display area;
    a first display panel disposed in the first display area and a second display panel disposed in the second display area, the first display area having a plurality of display sub-areas, each of the plurality of the display sub-areas being provided with a plurality of sub-display panels, each of the plurality of sub-display panels being independently driven;
    wherein each of the plurality of sub-display panels comprises:
    a first substrate;
    a first electrode layer formed on the first substrate, the first electrode layer comprising a plurality of first electrodes, at least one end of one of the plurality of first electrodes being adjacent to the second display panel;
    a first pixel definition layer formed on the first electrode layer; and
    a second electrode layer formed on the first pixel definition layer, the second electrode layer comprising a plurality of second electrodes.

12. The display screen of claim 11, wherein the first display panel is a PMOLED display panel, the second electrode layer comprises a plurality of second electrodes, and the plurality of second electrodes respectively intersecting across the plurality of first electrodes; the first display panel further comprises a plurality of electrode lead-out wires configured to lead out the plurality of first electrodes, each of the plurality of first electrodes in at least one of the plurality of display sub-areas is provided with one of the plurality of the electrode lead-out wires, the plurality of electrode lead-out wires are respectively connected to the plurality of first electrodes, and the plurality of electrode lead-out wires and the plurality of second electrodes in the same display sub-area extend in parallel in the same direction.

13. The display screen according to claim 12, wherein the display screen comprises three or more display sub-areas, each of the display sub-areas is connected in sequence, the plurality of second electrodes of each of the display sub-areas are parallel to and spaced apart from each other, at least each of the plurality of first electrodes in one of the display sub-areas between adjacent two display sub-areas is provided with at least one of the plurality of the electrode lead-out wires.

14. The display screen according to claim 12, wherein the plurality of electrode lead-out wires are disposed below the first pixel definition layer and between the first electrode layer and the first substrate, and a signal shielding layer is provided between the plurality of electrode lead-out wires and the first electrode layer.

15. The display screen according to claim 14, wherein the first display area comprises a first sub-display area and a second sub-display area adjacent to each other, a photosensitive device is disposed below the first sub-display area, and the first pixel definition layer comprises a light-transmitting first pixel definition layer corresponding to the first sub-display area, and the light-transmitting first pixel definition layer is made of a light-transmitting material.

16. The display screen according to claim 15, wherein the first pixel definition layer further comprises a light-blocking first pixel definition layer corresponding to the second sub-display area, and the light-blocking first pixel definition layer is made of an opaque material.

17. The display screen according to claim 12, wherein the plurality of electrode lead-out wires are disposed below the first pixel definition layer and above the first electrode layer, and a signal shielding layer is provided between the plurality of electrode lead-out wires and the first electrode layer.

18. The display panel according to claim 11, wherein:
the first display panel is an active-matrix organic light-emitting diode (AMOLED) display panel or an AMOLED-like display panel,
the AMOLED-like display panel comprising a plurality of pixel circuits disposed on the first substrate,
the plurality of pixel circuits being provided with the first electrode layer thereon, and each of the plurality of the pixel circuits comprises one switching device;
the first pixel definition layer has a plurality of pixel openings, and each of the plurality of pixel openings being provided with a light-emitting structure therein, each of the plurality of first electrodes corresponding to one light-emitting structure, and each of the plurality of first electrodes having a shape of one of a circular, an ellipse, a dumbbell, or a gourd.

19. A display terminal, comprising:
a device body having a notched area; and
a display screen covering on the device body, the display screen comprising:
a first display area and a second display area adjacent to each other, at least a portion of the first display area being connected to the second display area; and
a first display panel disposed in the first display area and a second display panel disposed in the second display area, the first display panel comprising:
a first substrate;
a first electrode layer formed on the first substrate, the first electrode layer comprising a plurality of first electrodes, at least one end of one of the plurality of the first electrodes being adjacent to the second display panel;
a first pixel definition layer formed on the first electrode layer;
a second electrode layer formed on the first pixel definition layer, the second electrode layer comprising a plurality of second electrodes, the plurality of second electrodes respectively intersecting across the plurality of first electrodes; and
a plurality of electrode lead-out wires configured to lead out the plurality of first electrodes, the plurality of electrode lead-out wires being respectively connected to the plurality of first electrodes, and respectively extending in parallel with the plurality of second electrodes in the same direction;
wherein side edges of the plurality of electrode lead-out wires are provided in a plurality of intersecting arcs, the plurality of electrode lead-out wires extend in parallel in the same direction, and adjacent electrode lead-out wires have a spacing therebetween; in an extending direction of the plurality of electrode lead-out wires, a width of one of the plurality of electrode lead-out wires changes continuously or intermittently, and the spacing changes continuously or intermittently;
wherein the notched area is located below the first display area, and the device body comprises a photosensitive device disposed in the notched area to collect light through the first display area.

20. The display terminal according to claim 19, wherein orthographic projections of the plurality of electrode lead-out wires on the first substrate and orthographic projections of the plurality of second electrodes on the first substrate are staggered from each other.

* * * * *